(12) United States Patent
Tan et al.

(10) Patent No.: US 8,778,772 B2
(45) Date of Patent: Jul. 15, 2014

(54) METHOD OF FORMING TRANSISTOR WITH INCREASED GATE WIDTH

(75) Inventors: Chung Foong Tan, Dresden (DE); Maciej Wiatr, Dresden (DE); Peter Javorka, Radeburg (DE); Falong Zhou, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 70 days.

(21) Appl. No.: 13/348,101

(22) Filed: Jan. 11, 2012

(65) Prior Publication Data
US 2013/0178045 A1    Jul. 11, 2013

(51) Int. Cl.
*H01L 21/283*    (2006.01)

(52) U.S. Cl.
USPC .... 438/430; 257/369; 257/411; 257/E21.546; 257/E27.062; 257/E29.242

(58) Field of Classification Search
CPC .............. H01L 21/823807; H01L 21/823814; H01L 29/7843; H01L 29/665; H01L 29/772; H01L 29/66545; H01L 29/7848; H01L 29/66636; H01L 29/785; H01L 21/76232; H01L 27/10876; H01L 27/11521; H01L 29/517; H01L 29/78; H01L 29/513; H01L 29/4966; H01L 21/76224; H01L 21/76229; H01L 29/7813; H01L 21/823878; H01L 29/0653
USPC .......................... 438/430, 438, 424, 199, 296
See application file for complete search history.

(56) References Cited

U.S. PATENT DOCUMENTS

| | | | |
|---|---|---|---|
| 7,955,937 B2 | 6/2011 | Wieczorek et al. | |
| 2002/0098661 A1* | 7/2002 | Cha et al. | 438/424 |
| 2010/0237432 A1* | 9/2010 | Takeoka et al. | 257/369 |
| 2011/0024846 A1 | 2/2011 | Kammler et al. | |

* cited by examiner

*Primary Examiner* — Chuong A Luu
*Assistant Examiner* — Rodolfo Fortich
(74) *Attorney, Agent, or Firm* — Amerson Law Firm, PLLC

(57) ABSTRACT

Methods of forming transistor devices having an increased gate width dimension are disclosed. In one example, the method includes forming an isolation structure in a semiconducting substrate, wherein the isolation structure defines an active region in the substrate, performing an ion implantation process on the isolation structure to create a damaged region in the isolation structure and, after performing the implantation process, performing an etching process to remove at least a portion of the damaged region to define a recess in the isolation structure, wherein a portion of the recess extends below an upper surface of the substrate and exposes a sidewall of the active region. The method further includes forming a gate insulation layer above the active region, wherein a portion of the insulation layer extends into the recess, and forming a gate electrode above the insulation layer, wherein a portion of the gate electrode extends into the recess.

16 Claims, 4 Drawing Sheets

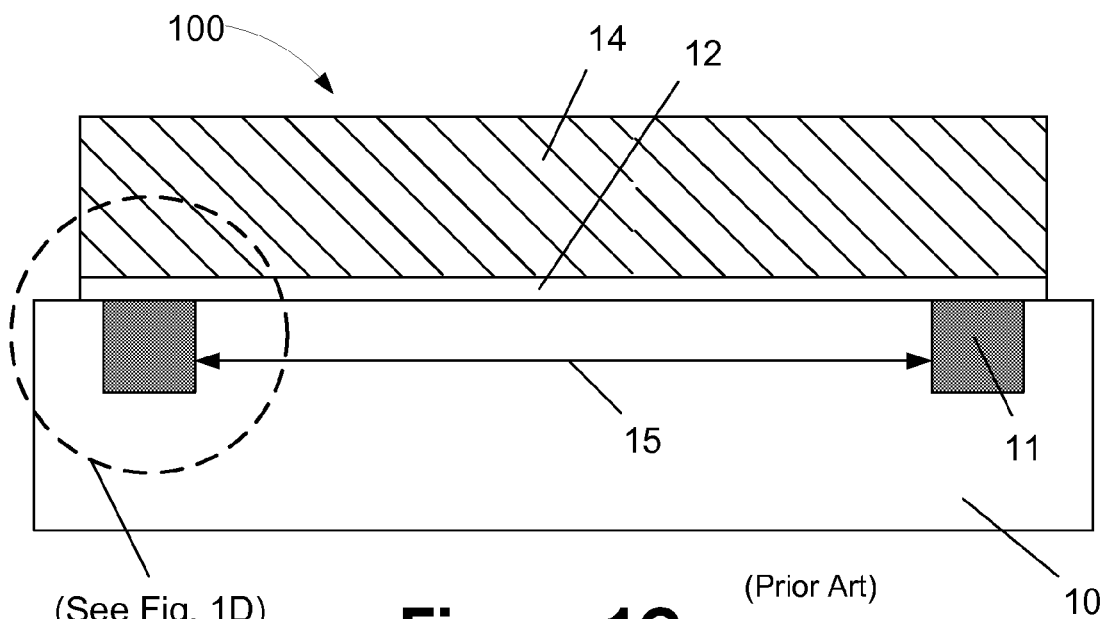
(See Fig. 1D) (Prior Art)
Figure 1C
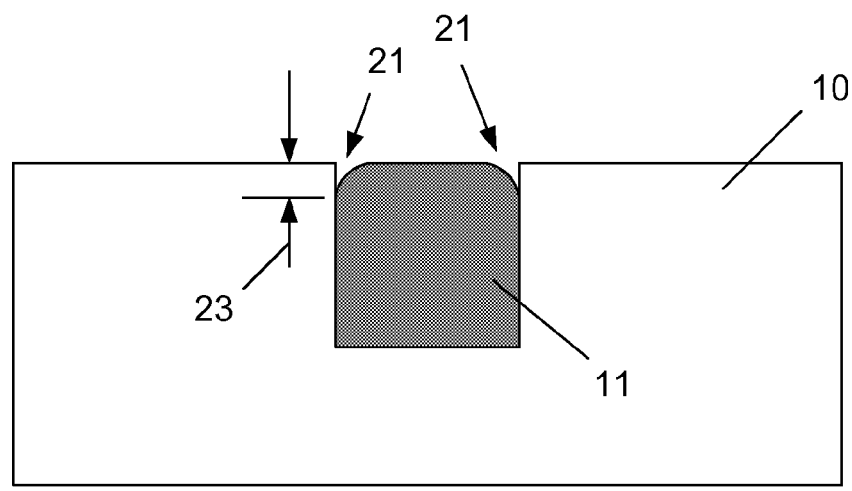
(Prior Art) Figure 1D

US 8,778,772 B2

METHOD OF FORMING TRANSISTOR WITH INCREASED GATE WIDTH

BACKGROUND OF THE INVENTION

1. Field of the Invention

Generally, the present disclosure generally relates to the manufacturing of sophisticated semiconductor devices, and, more specifically, to various methods of forming transistor devices having an increased gate width dimension.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NFET and PFET transistors) represent one important type of circuit element used in manufacturing such integrated circuit devices. A field effect transistor, irrespective of whether an NFET transistor or a PFET transistor is considered, typically comprises doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

Device designers are under constant pressure to increase the operating speed and electrical performance of transistors and integrated circuit products that employ such transistors. Given that the gate length (the distance between the source and drain regions) on modern transistor devices may be approximately 30-50 nm, and that further scaling is anticipated in the future, device designers have employed a variety of techniques in an effort to improve device performance, e.g., the use of high-k dielectrics, the use of metal gate electrode structures, the incorporation of work function metals in the gate electrode structure and the use of channel stress engineering techniques on transistors (create a tensile stress in the channel region for NFET transistors and create a compressive stress in the channel region for PFET transistors). Stress engineering techniques typically involve the formation of specifically made silicon nitride layers that are selectively formed above appropriate transistors, i.e., a layer of silicon nitride that is intended to impart a tensile stress in the channel region of an NFET transistor would only be formed above the NFET transistors. Such selective formation may be accomplished by masking the PFET transistors and then blanket depositing the layer of silicon nitride, or by initially blanket depositing the layer of silicon nitride across the entire substrate and then performing an etching process to selectively remove the silicon nitride from above the PFET transistors. Conversely, for PFET transistors, a layer of silicon nitride that is intended to impart a compressive stress in the channel region of a PFET transistor is formed above the PFET transistors.

FIGS. 1A-1D depict an illustrative prior art transistor 100. FIG. 1B is a plan view of the transistor 100 while FIGS. 1A and 1C are cross-sectional views of the transistor taken as indicated in FIG. 1B. FIG. 1D is an enlarged view of a portion of the transistor 100. As shown in FIGS. 1A-1C, the illustrative transistor 100 is formed above a semiconducting substrate 10 in and above an active area defined by an illustrative isolation structure 11. The transistor 100 generally comprises a gate insulation layer 12, a gate electrode 14, a sidewall spacer 16, a source region 18A and a drain region 18B. The approximate gate length (or channel length) 13 of the transistor 100 is depicted in FIG. 1A, whereas the approximate gate width (or channel width) 15 of the transistor is depicted in FIG. 1C.

Various materials of construction and techniques may be employed in forming the illustrative transistor 100. For example, the gate insulation layer 12 may be comprised of a variety of different materials, such as, for example, silicon dioxide, a so-called high-k (k greater than 10) insulation material, etc. Similarly, the gate electrode 14 may also be of a material such as polysilicon or amorphous silicon, or it may be comprised of one or more metal layers that act as the gate electrode 14. The gate electrode structure for the transistor 100 may be made using either so-called "gate-first" or "gate-last" techniques.

FIG. 1D is an enlarged view of a portion of the transistor 100 wherein the gate insulation layer 12 and the gate electrode 14 pass over the isolation structure 11. In one illustrative embodiment, the isolation structure 11 is a trench isolation structure that is performed using well-known techniques. Typically, a pad oxide layer (not shown) will be formed on the substrate 10 followed by the formation of a so-called pad nitride layer (not shown) on the pad oxide layer. The pad nitride layer is then patterned (using a patterned photoresist mask) to define a patterned hard mask. An etching process is then performed through the patterned hard mask to define a trench in the substrate 10. An insulating material, such as silicon dioxide, is then blanket deposited across the substrate 10 so as to over-fill the trench. A chemical mechanical polishing (CMP) process is then performed using the patterned hard mask layer as a polish stop layer to remove the insulating material that is positioned outside of the trench. The patterned hard mask is then removed. The resulting isolation structure 11, a so-called shallow trench isolation (STI) structure, is formed in the substrate 10 and it serves to electrically isolate the transistor 100 from other devices.

Although not depicted in FIGS. 1A-1D, due to the manner in which the isolation structure 11 is formed, the upper surface of the isolation structure 11 is typically above the surface 10S of the substrate 10. Ultimately, the transistor 100 will be subjected to many additional processing operations, such as etching and cleaning operations, which consume some of the isolation structure 11. As shown in FIG. 1D, these cleaning and etching processes result in so-called illustrative "divots" 21 in the isolation structure 11. In some cases, such divots 21 may have a depth 23 of about 1-2 nm, depending on the particular application. Depending upon the extent and location of such divots 21, the isolation function provided by the isolation structure 11 may be compromised. Ideally, none of the isolation structure 11 would be consumed in subsequent processing operations, however, that is not the case in real-world semiconductor manufacturing operations.

The present disclosure is directed various methods of forming transistor devices having an increased width dimension.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming transistor devices having an increased gate width dimension. In one example, the method includes forming an isolation structure in a semiconducting substrate, wherein the isolation structure defines an active region in the substrate, performing an ion implantation process on the isolation structure to create a damaged region in the isolation structure and, after performing the ion implantation process, performing an etching process to remove at least a portion of the damaged region to thereby define a recess in the isolation structure, wherein a portion of the recess extends below an upper surface of the semiconducting substrate and exposes a sidewall of the active region. The method includes the further steps of forming a gate insulation layer above the active region, wherein a portion of the gate insulation layer extends into the recess, and forming a gate electrode above the gate insulation layer, wherein a portion of the gate electrode extends into the recess.

Another illustrative method disclosed herein includes forming an isolation structure in a semiconducting substrate, wherein the isolation structure defines an active region in the substrate, performing an ion implantation process on the isolation structure to create a damaged region in the isolation structure and, after performing the ion implantation process, performing an etching process to remove at least a portion of the damaged region to thereby define a recess in the isolation structure, wherein a portion of the recess extends below an upper surface of the semiconducting substrate and exposes a sidewall of the active region. The method includes the additional steps of forming a gate insulation layer on the upper surface of the substrate and on the exposed sidewall of the active region, wherein a portion of the gate insulation layer extends below the surface of the substrate and into the recess, and forming a gate electrode above the gate insulation layer, wherein a portion of the gate electrode extends below the surface of the substrate and into the recess.

BRIEF DESCRIPTION OF THE DRAWINGS

The disclosure may be understood by reference to the following description taken in conjunction with the accompanying drawings, in which like reference numerals identify like elements, and in which:

FIGS. 1A-1D depict one illustrative process flow for forming an illustrative prior art transistor.

Figure 1A:
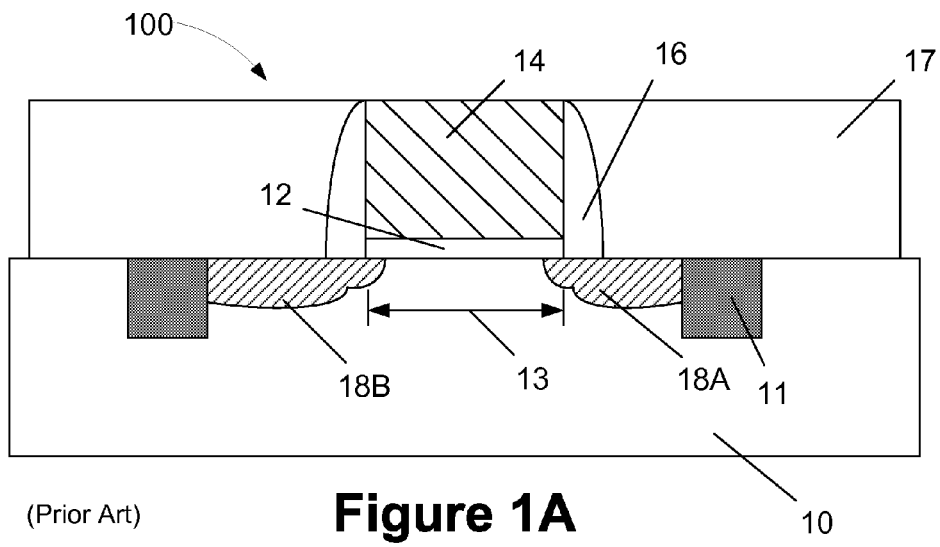
Figure 1B:
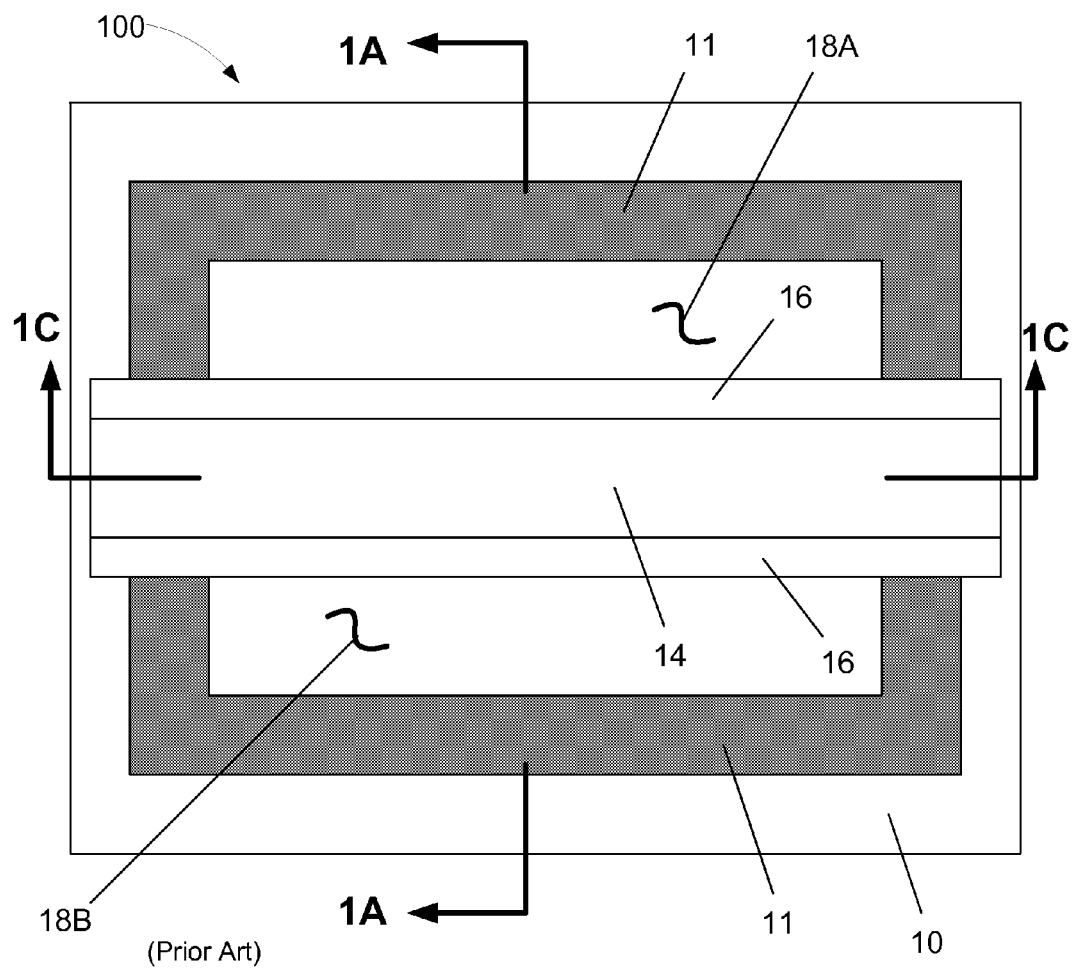

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming transistor devices having an increased gate width dimension. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, ASICs, logic devices, memory devices, etc. With reference to FIGS. 2A-2D, various illustrative embodiments of the methods and devices disclosed herein will now be described in more detail. To the extent like reference numbers are employed in FIGS. 1A-1D and FIGS. 2A-2D, the previous description of such structures applies equally to the structures depicted in FIGS. 2A-2D.

Figure 2A:
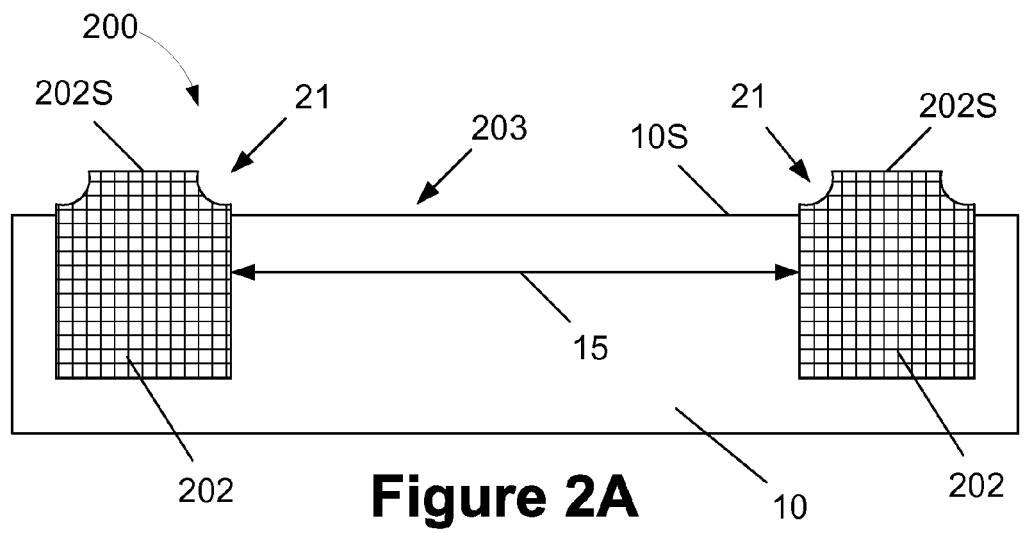
FIGS. 2A-2D depict various methods disclosed herein of forming transistor devices having an increased gate width dimension.

FIG. 2A is an enlarged cross-sectional view of an illustrative transistor 200 at an early stage of manufacturing. FIG. 2A is a cross-section taken along the gate width (or channel width) 15 of the transistor 200. The transistor 200 is formed above a semiconducting substrate 10. An illustrative trench isolation structure 202 is formed in the substrate 10 and defines an active area 203, in and above which the transistor 200 will be formed. Although not depicted in FIG. 2A, the transistor 200 that will be formed may be either an NFET transistor or a PFET transistor. The substrate 10 may have a variety of configurations, such as the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all semiconductor structures. The substrate 10 may also be made of materials other than silicon.

In general, with continuing reference to FIG. 2A, the trench isolation structure 202 may be made in a manner similar to that described previously for the isolation structure 11 depicted in FIGS. 1A-1D. In one illustrative embodiment, the isolation structure 202 may be made of silicon dioxide. The isolation structure 202 has an upper surface 202S that is positioned above the surface 10S of the substrate 10 by a distance that may typically range from about 4-5 nm when the isolation structure 202 is initially formed. The illustrative isolation structure 202 is depicted as having been subjected to some erosion or loss of material in the form of illustrative divots 21.

Figure 2B:
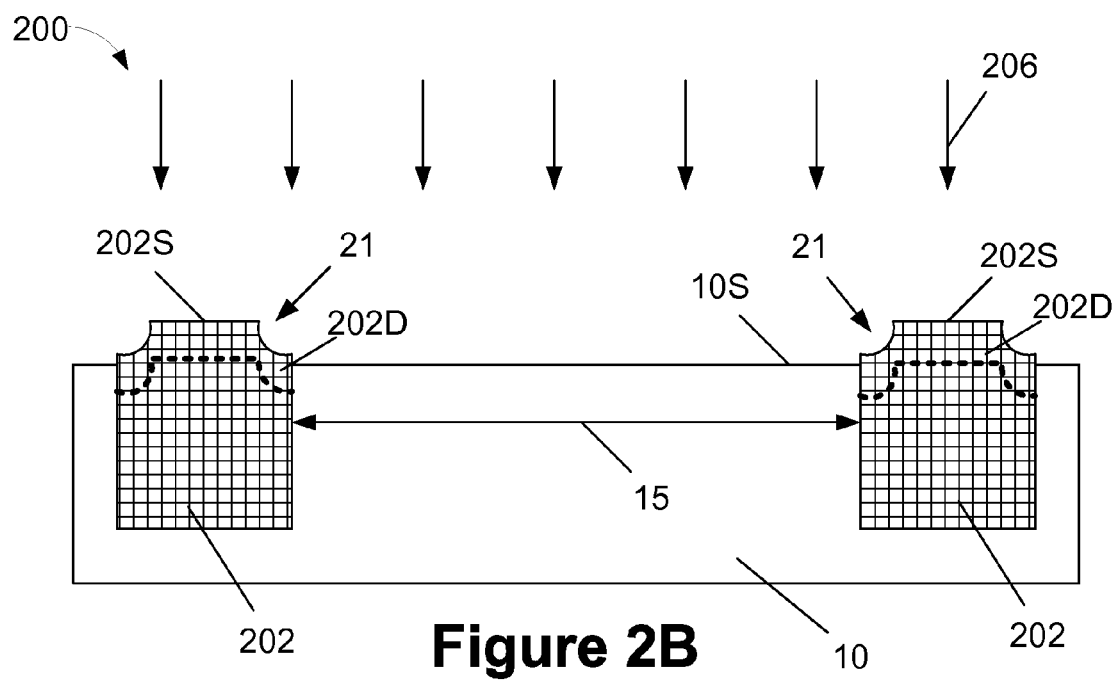

As shown in FIG. 2B, an ion implantation process 206 is performed to create damaged regions 202D in the isolation structure 202. The ion implantation process 206 may be performed with or without a masking layer, such as a photoresist mask (not shown) that would cover the active area 203 and expose the isolation structure 202 to the implantation process 206. The ion implantation process 206 may be performed with an electrically neutral material, such as silicon, germanium, nitrogen, carbon, etc. The ion dose and the implant energy used in the ion implantation process 206 should be such that the isolation structure 202 is sufficiently damaged without causing unacceptable damage to the surface 10S of the substrate 10. In one illustrative embodiment, the ion implantation process 206 may be performed using carbon at a dose of $1e^{14}$-$1e^{15}$ ions/cm$^2$ and at an energy level of approximately 5-15 keV.

Figure 2C:
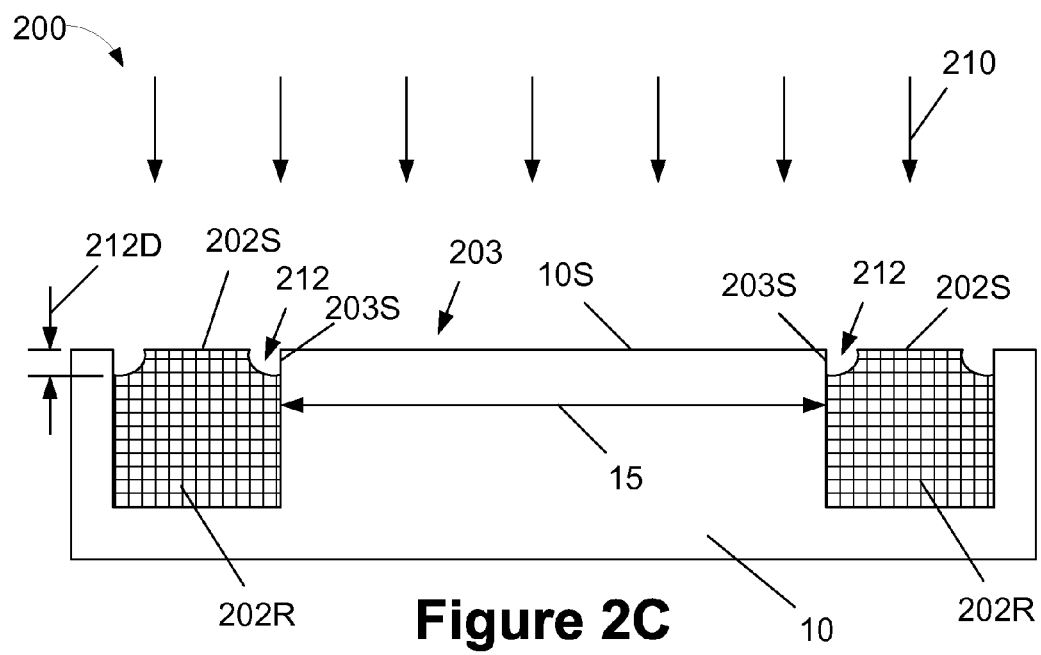

The purpose of the ion implantation process 206 is to create the damaged regions 202D that will be easier to remove, relative to the undamaged portions of the isolation structure 202, in a subsequent etching process. To that end, FIG. 2C depicts the transistor 200 after an etching process 210 is performed to remove the damaged regions 202D of the isolation structures 202. The etching process 210 may be either a dry (a mild RIE etch) or a wet etching process (dilute HF acid). The damaged regions 202D etch at a faster rate than does the undamaged portions of the isolation structure 202. This higher etch rate slows down as the etch front reaches the boundary between the damaged region 202D and the undamaged portions of the isolation structure 202. This etching process results in the formation of relatively large recesses 212 in the reduced-thickness isolation structure 202R shown in FIG. 2C. The recesses 212 expose sidewalls 203S of the active region 203. The depth 212D of the recesses 212 depends upon a variety of factors, such as the parameters and materials used in the ion implantation process 206, the material used for the isolation structure 202 and the etchant employed in the etching process 210, etc. In one illustrative embodiment where the isolation region 202 is comprised of silicon dioxide, the depth 212D of the recesses 212 formed in the isolation structure 202R may be about 10-20 nm relative to the surface 10S of the substrate 10. In one illustrative embodiment, the implantation process 206 and the etching process 210 should be controlled such that the upper surface 202S of the reduced isolation structure 202R is even with or above the surface 10S of the substrate 10. The relatively deeper recesses 212 provide a means by which to effectively increase the gate width of the transistor 200 that will be formed in and above the active region 203.

Figure 2D:
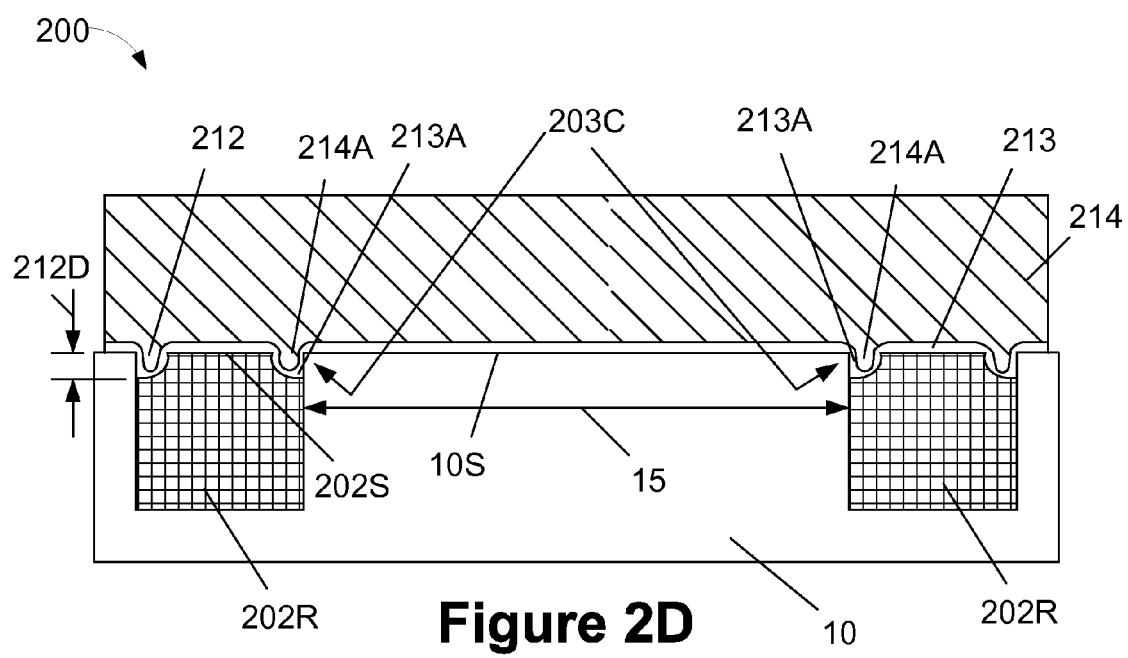

FIG. 2D depicts the transistor 200 after several process operations have been performed. More specifically, an illustrative gate insulation layer 213 and an illustrative gate electrode 214 have been formed above the substrate 10. The gate insulation layer 213 comprises portions or protrusions 213A that extend around the corner 203C of the active region 203 and into the recesses 212. Similarly, the gate electrode layer 214 comprises portions or protrusions 214A that extend around the corner 203C of the active region 203 and into the recesses 212. Even more specifically, in one embodiment, the portions 213A of the gate insulation layer 213 are formed on the exposed sidewalls 203S of the active region 203 and the gate electrode layer 214 is formed on the gate insulation layer 213.

As will be recognized by those skilled in the art after a complete reading of the present application, the gate electrode structure of the transistor 200 depicted in the drawings, i.e., the gate insulation layer 213 and the gate electrode 214, is intended to be representative in nature. For example, the gate insulation layer 213 may be comprised of a variety of different materials, such as, for example, silicon dioxide, a so-called high-k (k greater than 10) insulation material, etc. Similarly, the gate electrode 214 may also be of a material such as polysilicon or amorphous silicon, or it may be comprised of one or more metal layers that act as the gate electrode 214. That is, the gate electrode structure of the transistor 200 may be comprised of a variety of different materials, it may they have a variety of configurations, and the gate electrode structure may be made using either so-called "gate-first" or "gate-last" techniques. The gate insulation layer 213 and the gate electrode 214 may be formed using traditional techniques. For example, the gate insulation layer 213 may be formed by performing a thermal growth process of by performing a deposition process, depending upon the material selected for the gate insulation layer 213. Similarly, the gate electrode 214 may be formed by depositing one or more layers of material that will comprise the gate electrode (plus any capping materials if desired) and thereafter patterning the layers of material to define the basic gate electrode stack of material using known photolithography and etching techniques. Of course, as will be recognized by those skilled in the art, FIG. 2D does not depict all of the details of construction of the completed transistor 200. That is, the transistor 200 when completed will have source/drain regions and may have one or more sidewall spacers similar to those depicted for the prior art transistor 100 shown in FIGS. 1A-1D. Additionally, using traditional techniques, conductive contacts (not shown) and various metallization structures, e.g., conductive lines and vias (not shown), are formed above the transistor 200.

Using the techniques disclosed herein, the gate width of the transistor 200 may be increased relative to the gate width 15 of the prior art transistor 100 depicted in FIGS. 1A-1D. For example, using the methodologies disclosed herein, significant improvement in electrical characteristics of the resulting transistor 200 can be observed. In the illustrative case where the transistor 200 is an NFET device with a nominal narrow gate width of about 72 nm, the methods disclosed herein provide an increase in the gate width of about 4 nm on each end where the portions 213A, 214A extended down into the recesses 212 around the corner 203C of the active region 203. This resulted in an increase in the gate width of the narrow width device of about 11% (80/72=1.11) with a corresponding increase in the $I_{on}/I_{off}$ performance characteristic of the illustrative NFET transistor of about 10%. In another case where an NFET transistor having a relatively wide channel width of about 900 nm was made using the techniques disclosed herein, an improvement of about 9% in the $I_{on}/I_{off}$ characteristic of the transistor was observed due to the increase in the channel width of the transistor as described herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a transistor, comprising:
   forming a silicon dioxide isolation structure in a semiconducting substrate, said silicon dioxide isolation structure defining an active region in said substrate;
   performing an ion implantation process using an electrically neutral material on an entire upper surface of said silicon dioxide isolation structure to create a damaged region in said silicon dioxide isolation structure, wherein said damaged region of said silicon dioxide isolation structure etches at a faster rate than an undamaged region of said silicon dioxide isolation structure;
   after performing said ion implantation process, performing an etching process to remove at least a portion of said damaged region to thereby define a recess in said silicon dioxide isolation structure, wherein a portion of said recess extends below an upper surface of said semiconducting substrate and exposes a sidewall of said active region;
   forming a gate insulation layer above said active region, wherein a portion of said gate insulation layer extends into said recess; and
   forming a gate electrode above said gate insulation layer, wherein a portion of said gate electrode extends into said recess.

2. The method of claim 1, wherein said electrically neutral material is comprised of at least one of silicon, germanium, nitrogen or carbon.

3. The method of claim 1, wherein said transistor is an NFET transistor.

4. The method of claim 1, wherein forming said gate insulation layer above said active region comprises forming said gate insulation layer on said upper surface of said substrate and on said exposed sidewall of said active region.

5. The method of claim 4, wherein forming said gate insulation layer comprises thermally growing said gate insulation layer.

6. The method of claim 1, wherein, after said etching process is performed, a portion of an upper surface of said isolation structure is positioned at a level that is the same as or above a level of said surface of said substrate.

7. A method of forming a transistor, comprising:
   forming a silicon dioxide isolation structure in a semiconducting substrate, said silicon dioxide isolation structure defining an active region in said substrate;
   forming a patterned mask layer above said semiconducting substrate that exposes an entire upper surface of said silicon dioxide isolation structure and covers said active region;
   performing an ion implantation process on said entire upper surface of said silicon dioxide, isolation structure through said patterned mask layer to create a damaged region in said silicon dioxide isolation structure, wherein said damaged region of said silicon dioxide isolation structure etches at a faster rate than an undamaged region of said silicon dioxide isolation structure;
   after performing said ion implantation process, performing an etching process to remove at least a portion of said damaged region to thereby define a recess in said silicon dioxide isolation structure, wherein a portion of said recess extends below an upper surface of said semiconducting substrate and exposes a sidewall of said active region;
   forming a gate insulation layer on said upper surface of said substrate and on said exposed sidewall of said active region, wherein a portion of said gate insulation layer extends below said surface of said substrate and into said recess; and
   forming a gate electrode above said gate insulation layer, wherein a portion of said gate electrode extends below said surface of said substrate and into said recess.

8. The method of claim 7, wherein performing said ion implantation process on said isolation structure to create said damaged region in said isolation structure comprises performing said ion implantation process using an electrically neutral material.

9. The method of claim 8, wherein said electrically neutral material is comprised of at least one of silicon, germanium, nitrogen or carbon.

10. The method of claim 7, wherein forming said gate insulation layer comprises thermally growing said gate insulation layer.

11. The method of claim 7, wherein, after said etching process is performed, a portion of an upper surface of said isolation structure is positioned at a level that is the same as or above a level of said surface of said substrate.

12. A method of forming a transistor, comprising:
   forming a silicon dioxide isolation structure in a semiconducting substrate, said silicon dioxide isolation structure defining an active region in said substrate;
   forming a patterned mask layer above said semiconducting substrate that exposes an entire upper surface of said silicon dioxide isolation structure and covers said active region;
   performing an ion implantation process using an electrically neutral material on said entire upper surface of said silicon dioxide isolation structure through said patterned mask layer to create a damaged region in said silicon dioxide isolation structure, wherein said damaged region of said silicon dioxide isolation structure etches at a faster rate than an undamaged region of said silicon dioxide isolation structure;
   after performing said ion implantation process, performing an etching process to remove at least a portion of said damaged region to thereby define a recess in said isolation structure, wherein a portion of said recess extends below an upper surface of said semiconducting substrate and exposes a sidewall of said active region;
   forming a gate insulation layer on said upper surface of said substrate and on said exposed sidewall of said active region, wherein a portion of said gate insulation layer extends below said surface of said substrate and into said recess; and
   forming a gate electrode above said gate insulation layer, wherein a portion of said gate electrode extends below said surface of said substrate and into said recess.

13. The method of claim 12, wherein said electrically neutral material is comprised of at least one of silicon, germanium, nitrogen or carbon.

14. The method of claim 12, wherein, after said etching process is performed, a portion of an upper surface of said isolation structure is positioned at a level that is the same as or above a level of said surface of said substrate.

15. A method of forming a transistor, comprising:
   forming a silicon dioxide isolation structure in a semiconducting substrate, said silicon dioxide isolation structure defining an active region in said substrate, wherein said silicon dioxide isolation structure has an upper surface and wherein said active region has an upper surface;
   after forming said isolation structure, and with said upper surface of said active region and said entire upper surface of said silicon dioxide isolation structure exposed, performing an ion implantation process using an electrically neutral material on said entire upper surface of said silicon dioxide isolation structure and said upper surface of said active region so as to create a damaged region in said silicon dioxide isolation structure, wherein said damaged region of said silicon dioxide isolation structure etches at a faster rate than an undamaged region of said silicon dioxide isolation structure;

after performing said ion implantation process, performing an etching process to remove at least a portion of said damaged region to thereby define a recess in said isolation structure, wherein a portion of said recess extends below an upper surface of said active region and exposes a sidewall of said active region;

forming a gate insulation layer above said active region, wherein a portion of said gate insulation layer extends into said recess; and forming a gate electrode above said gate insulation layer, wherein a portion of said gate electrode extends into said recess.

16. A method of forming a transistor, comprising:

forming a silicon dioxide isolation structure in a semiconducting substrate, said silicon dioxide isolation structure defining an active region in said substrate;

after forming said silicon dioxide isolation structure, performing an ion implantation process on an entire upper surface of said silicon dioxide isolation structure to create a damaged region in said isolation structure, wherein said ion implantation process is performed using one at last one of silicon, germanium, nitrogen or carbon and wherein said damaged region of said silicon dioxide isolation structure etches at a faster rate than an undamaged region of said silicon dioxide isolation structure;

after performing said ion implantation process, performing an etching process to remove at least a portion of said damaged region to thereby define a recess in said isolation structure, wherein a portion of said recess extends below an upper surface of said active region and exposes a sidewall of said active region;

forming a gate insulation layer above said active region, wherein a portion of said gate insulation layer extends into said recess; and forming a gate electrode above said gate insulation layer, wherein a portion of said gate electrode extends into said recess.

* * * * *

UNITED STATES PATENT AND TRADEMARK OFFICE
CERTIFICATE OF CORRECTION

| | | |
|---|---|---|
| PATENT NO. | : 8,778,772 B2 | Page 1 of 1 |
| APPLICATION NO. | : 13/348101 | |
| DATED | : July 15, 2014 | |
| INVENTOR(S) | : Tan et al. | |

It is certified that error appears in the above-identified patent and that said Letters Patent is hereby corrected as shown below:

In the Claims

Claim 16, column 10, lines 5-6, delete "one at last one of" and insert therefor -- at least one of --.

Signed and Sealed this
Seventh Day of October, 2014

Michelle K. Lee
*Deputy Director of the United States Patent and Trademark Office*